(12) United States Patent
Shimodaira

(10) Patent No.: US 9,543,497 B2
(45) Date of Patent: Jan. 10, 2017

(54) PIEZOELECTRIC DEVICE AND ELECTRONIC APPARATUS

(71) Applicant: SEIKO EPSON CORPORATION, Tokyo (JP)

(72) Inventor: Kazuhiko Shimodaira, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 98 days.

(21) Appl. No.: 13/751,750

(22) Filed: Jan. 28, 2013

(65) Prior Publication Data

US 2013/0221801 A1 Aug. 29, 2013

Related U.S. Application Data

(62) Division of application No. 12/404,816, filed on Mar. 16, 2009, now Pat. No. 8,760,231.

(30) Foreign Application Priority Data

Mar. 17, 2008 (JP) .................. 2008-067193

(51) Int. Cl.
*H03B 1/00* (2006.01)
*H01L 41/047* (2006.01)
(Continued)

(52) U.S. Cl.
CPC ........... *H01L 41/0475* (2013.01); *H01L 41/09* (2013.01); *H03H 9/0547* (2013.01);
(Continued)

(58) Field of Classification Search
CPC ................ H01L 2224/73265; H01L 23/49838; H01L 23/481; H01L 24/49; H01L 41/053; H01L 41/08; H01L 41/23; H01L 27/20
(Continued)

(56) References Cited

U.S. PATENT DOCUMENTS

| 6,204,074 B1 | 3/2001 | Bertolet et al. |
| 2005/0093167 A1* | 5/2005 | Saeki ................ H01L 23/49833 257/774 |

(Continued)

FOREIGN PATENT DOCUMENTS

| JP | A-2004-015441 | | 1/2004 |
| JP | 2006013681 A | * | 1/2006 |
| JP | A-2006-020140 | | 1/2006 |

*Primary Examiner* — Meiya Li
(74) *Attorney, Agent, or Firm* — Oliff PLC

(57) ABSTRACT

A piezoelectric device includes an integrated circuit (IC) chip and a piezoelectric resonator element, a part of the piezoelectric resonator element being disposed so as to overlap with a part of the IC chip when viewed in plan. The IC chip includes: an inner pad disposed on an active face and in an area where is overlapped with the piezoelectric resonator when viewed in plan; an insulating layer formed on the active face; a relocation pad disposed on the insulating layer and in an area other than a part where is overlapped with the piezoelectric resonator element, the relocation pad being coupled to an end part of a first wire; and a second wire electrically coupling the inner pad and the relocation pad, the second wire having a relocation wire and a connector that penetrates the insulating layer, the relocation wire being disposed between the insulating layer and the active face.

5 Claims, 8 Drawing Sheets

(51) Int. Cl.
  *H03H 9/05* (2006.01)
  *H03H 9/10* (2006.01)
  *H01L 41/09* (2006.01)

(52) U.S. Cl.
  CPC . *H03H 9/1021* (2013.01); *H01L 2224/05554* (2013.01); *H01L 2224/48091* (2013.01)

(58) Field of Classification Search
  USPC .......... 257/14–416, 678, 685, 686, E27.006; 438/50–53, 106, 109; 313/311, 313 R, 313/313 A, 317, 318, 323.06, 340, 344, 345, 313/348, 365; 331/68, 73, 107 R, 108 C, 108 D, 331/116 R, 116 M, 139, 154, 155
  See application file for complete search history.

(56) References Cited

U.S. PATENT DOCUMENTS

| | | | |
|---|---|---|---|
| 2005/0121804 A1* | 6/2005 | Kuo et al. | 257/781 |
| 2006/0022311 A1* | 2/2006 | Lin | 257/649 |
| 2006/0055479 A1* | 3/2006 | Okazaki et al. | 331/158 |
| 2007/0096313 A1 | 5/2007 | Chou et al. | |
| 2007/0275503 A1* | 11/2007 | Lin | C25D 3/48 |
| | | | 438/106 |
| 2010/0225405 A1 | 9/2010 | Navet | |

* cited by examiner

PIEZOELECTRIC DEVICE AND ELECTRONIC APPARATUS

This application is a divisional application of and claims the benefit of U.S. application Ser. No. 12/404,816 filed on Mar. 16, 2009, the disclosure of which is incorporated by reference herein.

BACKGROUND

1. Technical Field

The present invention relates to a piezoelectric device and an electronic apparatus, and more particularly relates to a piezoelectric device that has a piezoelectric resonator element and a circuit which oscillates the piezoelectric resonator element, and to an electronic apparatus having such piezoelectric device.

2. Related Art

There is a piezoelectric device having a piezoelectric resonator element and a circuit (an oscillation circuit) that is conductively coupled with the piezoelectric resonator element and oscillates the element in a package. JP-A-2004-15441 is a first example of related art. The oscillation circuit is an integrated circuit (IC) chip having an active face where a pad to which a wire is coupled is provided. According to the first example, the package includes a package base that has a concave portion whose opening faces upward and a lid that is placed onto an upper face of the package base and seals the concave portion. The concave portion has a lateral face which is formed in a stair-like shape and two step portions are provided there. The IC chip whose active face is directed upward is fixed onto a bottom face of the concave portion. A wire couples the pad that is provided on the active face with a pad electrode that is disposed on a lower step portion. The piezoelectric resonator element is bonded and fixed onto a package-side mount electrode (mount electrode) which is provided on an upper step portion by using a conductive adhesive. As described above, in the piezoelectric device, the IC chip and the piezoelectric resonator element are arranged in a vertical direction such that a principal plane of the piezoelectric resonator element faces the active face of the IC chip and the wire is provided between the principal plane and the active face.

JP-A-2006-20140 is a second example of related art. The second example discloses a piezoelectric oscillator in which a piezoelectric resonator element and an IC chip are disposed in a vertical direction, and a longer side of the IC chip and a longer side of the piezoelectric resonator element cross each other when they are viewed in plan. In this case, a shorter side of the IC chip does not cross over the piezoelectric resonator element when viewed in plan therefore it is possible to dispose a pad in an area where the IC chip and the piezoelectric resonator element do not overlap each other. In this way, a wire is not arranged between the principal plane of the piezoelectric resonator element and the active face of the IC chip.

In case of the piezoelectric device in which a wire is disposed between the principal plane of the piezoelectric resonator element and the active face of the IC chip as described in the first example, a gap for avoiding the piezoelectric resonator element from contacting with the wire should be provided because an oscillation defect and the like can occur when the piezoelectric resonator element and the wire contact each other. However, when the gap between the piezoelectric resonator element and the wire is wide, it is impossible to make the piezoelectric device thin.

In case of the piezoelectric device in which the longer side of the piezoelectric resonator element is arranged so as to cross over the longer side of the IC chip when viewed in plan and the pad is disposed laterally to the piezoelectric resonator element as described in the second example, there is a disadvantage of a large planar size of the piezoelectric device. Moreover, the IC chip has to be made in a rectangular shape when viewed in plan and the pad should be disposed along the shorter side of the IC chip. This particular arrangement of the pad limits the versatility of the IC chip use such that it cannot be used for some different arrangements in the package even with a piezoelectric device having the same function.

SUMMARY

An advantage of the present invention is to provide a thin piezoelectric device and an electronic apparatus having such piezoelectric device.

A piezoelectric device according to one aspect of the invention includes an integrated circuit (IC) chip and a piezoelectric resonator element, a part of the piezoelectric resonator element being disposed so as to overlap with a part of the IC chip when viewed in plan. The IC chip includes an inner pad disposed on an active face and in an area where is overlapped with the piezoelectric resonator when viewed in plan, an insulating layer formed on the active face, a relocation pad disposed on the insulating layer and in an area other than a part where is overlapped with the piezoelectric resonator element, the relocation pad being coupled to an end part of a first wire, and a second wire electrically coupling the inner pad and the relocation pad, the second wire having a relocation wire and a connector that penetrates the insulating layer, the relocation wire being disposed between the insulating layer and the active face.

According to the aspect of the invention, the location of the pad can be freely changed through the relocation wire, the connector, the relocation pad and the insulating layer. When the piezoelectric resonator element is arranged at the same position as the IC chip when they are viewed in plan, the relocation pad can be disposed in this area where the piezoelectric resonator element does not overlap with the IC chip irrespective of the position of the pad which is provided on one face of the IC chip. In this arrangement, the first wire can be extended from the relocation pad to the position adjacent to the piezoelectric resonator element, in other words, the first wire will not be provided between the piezoelectric resonator element and the IC chip. In this way, it is possible to reduce the thickness of the piezoelectric device. Moreover, the other end of the relocation wire can be disposed in a peripheral part of the one face. When the relocation pad is disposed along the edge of the IC chip when viewed in plan, the piezoelectric resonator element does not have to be displaced much in the planar direction. This feature also makes it possible to reduce the planar size of the piezoelectric device.

In this case, the relocation pad may be disposed adjacent to at least one side of a peripheral part of the IC chip. In this way, one side of the peripheral part on the one face is not overlapped by the piezoelectric resonator element when viewed in plan, but other three sides can be overlapped with the piezoelectric resonator element. Thereby the piezoelectric resonator element can be made wider and the area where an excitation electrode is provided can also be made larger. In this way, it is possible to reduce the thickness of the piezoelectric device and to improve its characteristics.

In this case, the piezoelectric device may further include a mount electrode that is provided on the insulating layer, and the piezoelectric resonator element is mounted on the mount electrode. In this way, the piezoelectric resonator element can be fixed and bonded onto the IC chip. In addition, the wire is not disposed between the IC chip and the piezoelectric resonator element so that it is possible to reduce the thickness of the piezoelectric device.

In this case, the piezoelectric device may further include a frequency adjustor element that adjusts oscillation frequency and is coupled to the relocation wire. In this way, an oscillation frequency can be adjusted with the frequency adjustor element provided in the IC chip. Therefore it is not needed to separately provide other circuits for adjusting the oscillation frequency. Moreover, it is possible to facilitate adjustment work of circuit parts.

An electronic apparatus according to one aspect of the invention includes the above-described piezoelectric device. In this way, it is possible to reduce the size of the electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
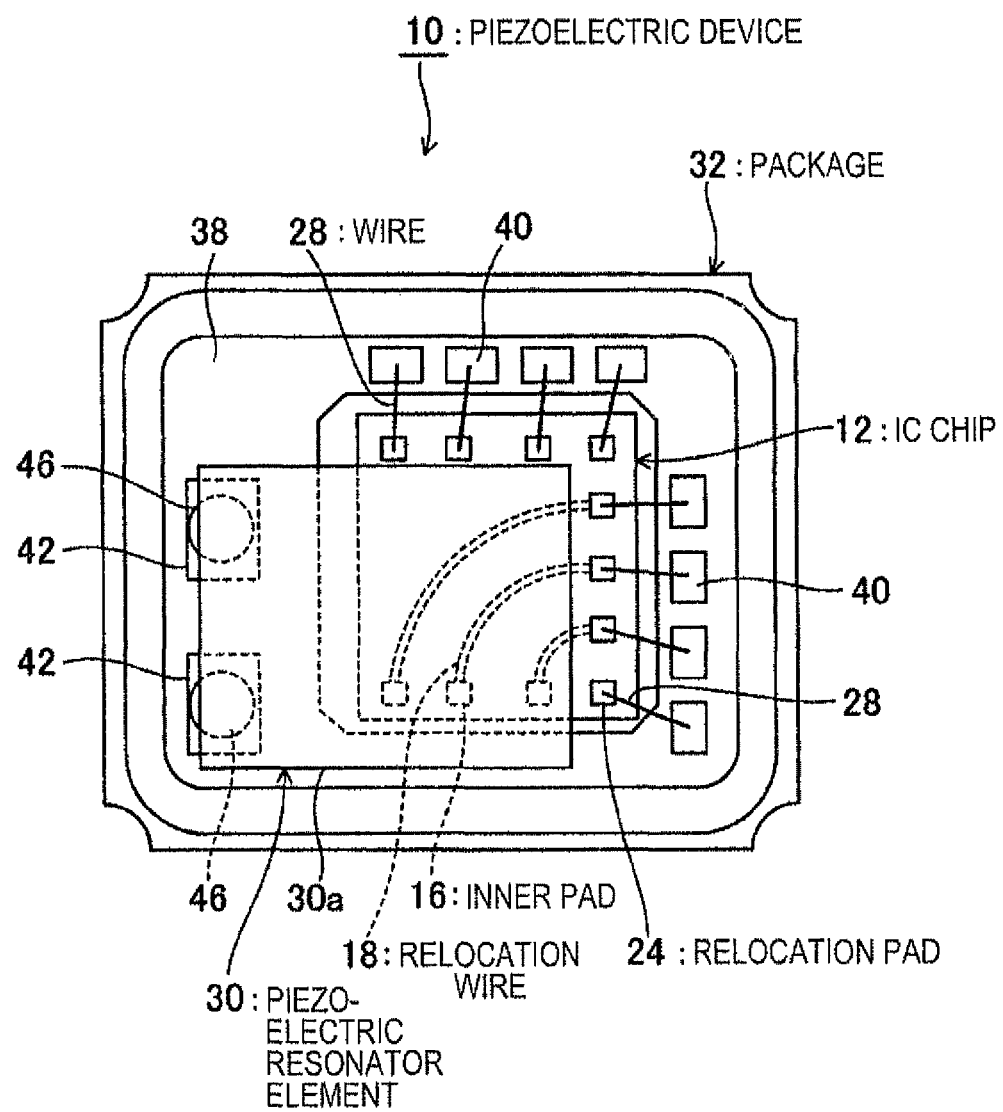
FIG. 1 is a plan view of a piezoelectric device.
Figure 2:
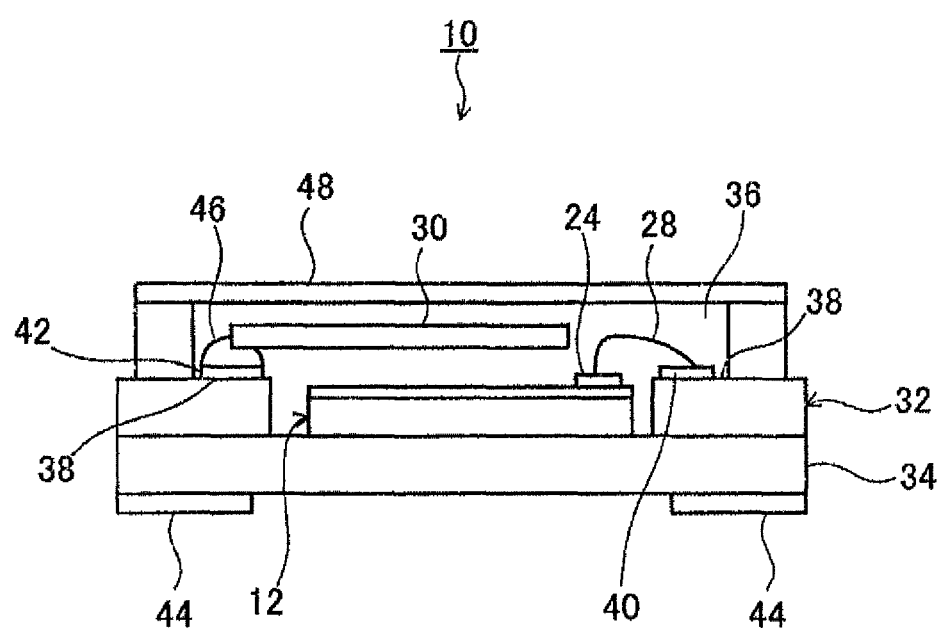
FIG. 2 is a sectional view of the piezoelectric device.
Figure 3:
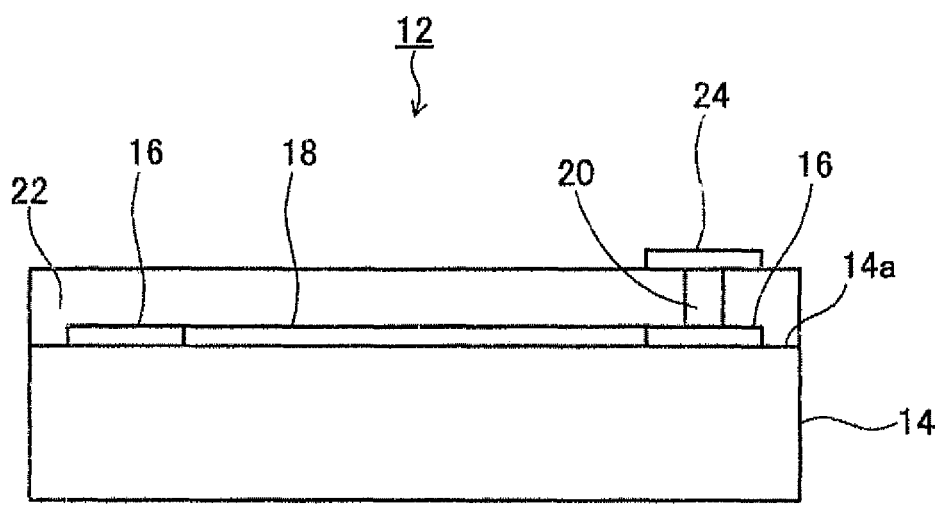
FIG. 3 is a schematic sectional view of an IC chip.
Figure 4A:
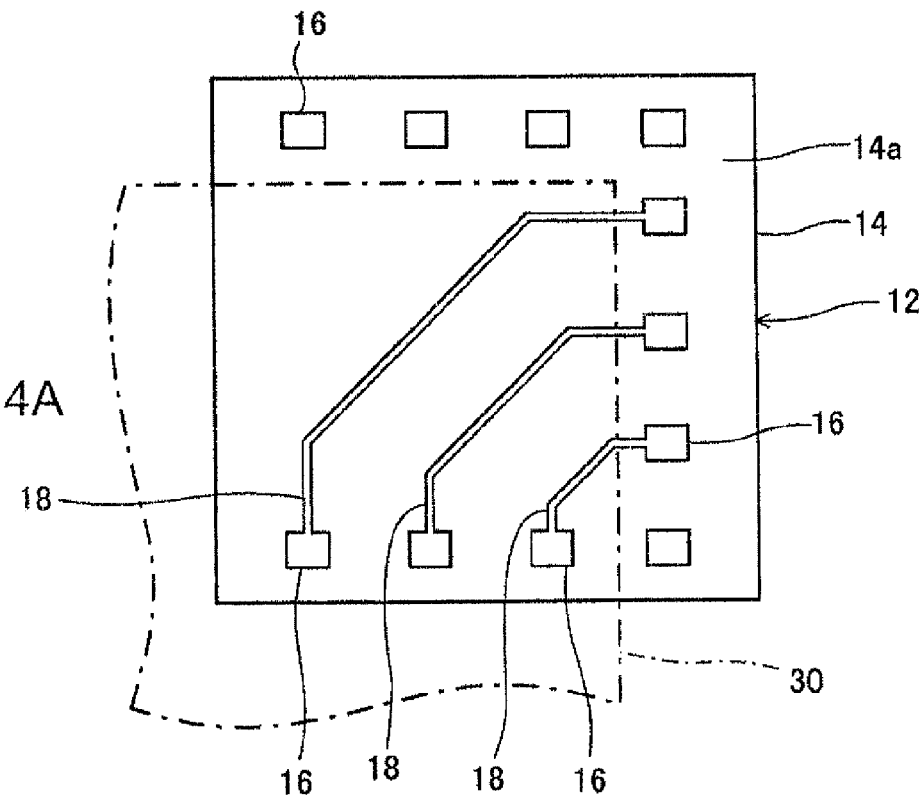
FIGS. 4A and 4B are plan views of the IC chip showing an active face of a semiconductor element and a face of an insulating layer.
Figure 4B:
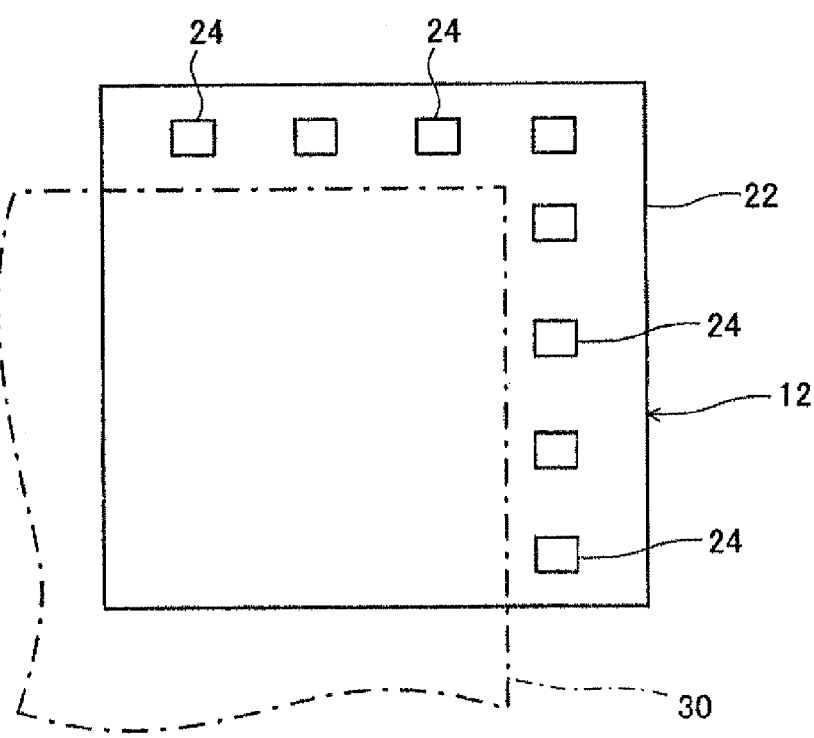

Embodiments of the invention will be described. FIG. 1 is a plan view of a piezoelectric device. FIG. 1 shows a state when a lid is removed from the device. FIG. 2 is a sectional view of the piezoelectric device. FIG. 3 is a schematic sectional view of an IC chip. FIGS. 4A and 4B are plan views of the IC chip showing an active face of a semiconductor element and a surface of an insulating layer.

Referring to FIG. 1 and FIG. 2, a piezoelectric device 10 includes an IC chip 12 and a piezoelectric resonator element 30 which are disposed in a layered direction and placed in a package 32. Referring to FIG. 3, the IC chip 12 includes a semiconductor element 14 in which a circuit is formed and an insulating layer 22 which is provided on an active face 14a (on one face) of the semiconductor element 14.

The semiconductor element 14 has a circuit (an oscillation circuit) that amplifies an electric signal which is inputted or outputted into/from the piezoelectric resonator element 30. The semiconductor element 14 further has an inner pad 16 which is provided in the plural number on its outer face. Referring to FIG. 4A, a re-location wire 18 which is disposed on the active face 14a is coupled with the inner pad 16. The dashed-dotted line in FIG. 4A denotes the piezoelectric resonator element 30. One end of the relocation wire 18 is coupled to the inner pad 16 with which the piezoelectric resonator element 30 overlaps when viewed in plan. The other end of the relocation wire 18 is coupled to the inner pad 16 with which the piezoelectric resonator element 30 does not overlap. In the embodiment shown with reference to FIG. 4A, the inner pads 16 are arranged along the two sides (an upper edge and a lower edge of the semiconductor element 14) which are the peripheral part of the active face 14a. The three inner pads 16 (disposed along the lower edge of the semiconductor element 14) which are overlapped with the piezoelectric resonator element 30 when viewed in plan are coupled with the relocation wires 18 which extend toward the right side of the active face 14a, and the inner pads 16 are practically relocated to the right edge part of the active face 14a so that the inner pads 16 are not overlapped by the piezoelectric resonator element 30.

The insulating layer 22 can be made of any insulating materials as long as it can cover the active face 14a, the inner pad 16 and the relocation wire 18, for example, can be made of resin such as polyimide. Referring to FIG. 3, in the insulating layer 22, a connector 20 that reaches from a face contacting with the active face 14a to the outer face (the upper face in this embodiment) is provided. The connector 20 is coupled to the inner pad 16 (the other end of the relocation wire 18) which is not overlapped with the piezoelectric resonator element 30. Therefore, in the embodiment shown in FIG. 4A, the connector is conductively coupled to the inner pad 16 that is disposed along the upper edge of the active face 14a and to the inner pad 16 that is disposed along the right edge of the active face 14a.

Referring to FIG. 3 and FIG. 4B, a relocation pad 24 is provided in the area where the connector 20 is exposed outside the surface of the insulating layer 22. A wire 28 and the like is connected to the relocation pad 24. The relocation pad 24 is conductively coupled to the inner pad 16 through the connector 20 and the relocation wire 18, or through the connector 20. The relocation pad 24 is not overlapped by the piezoelectric resonator element 30 when viewed in plan. As described above, in other words, the IC ship 12 relocates the position of the inner pad 16 by providing the relocation wire 18, the connector 20, the relocation pad 24 and the insulating layer 22.

The piezoelectric resonator element 30 shown in FIG. 1 and FIG. 2 can be any resonator that vibrates and oscillates when an electric signal is supplied, for example, can be made from a piezoelectric plate 30a on which an electrode pattern (not shown in the drawings) such as an excitation electrode and a mounting electrode is formed.

The package 32 includes a package base 34 and a lid 48. The package base 34 has a concave portion 36. A step part 38 is provided on the side face of the concave portion 36. The package base 34 can be formed by for example jointing a plate-shaped isolation sheet and a frame-shaped isolation sheet. A seam-ring is then placed and bonded on an upper face of the frame-shaped isolation sheet. In this way, it is possible to form a cavity in which the piezoelectric resonator element 30 is placed. Other than the method using the seam-ring, the cavity can also be formed by providing another frame-shaped isolation sheet (a second frame-shaped isolation sheet) but in this case a joint part has to be further provided on the second frame-shaped isolation sheet in order to place the lid 48. Whereas the cavity is formed by using the seam-ring, the lid 48 can be placed directly on the seam-ring so that the height of the piezoelectric device 10 can be reduced compared to the other method described above.

On the upper face of the step part 38, a pad electrode 40 which is coupled with the wire 28, and a mount electrode 42 onto which the piezoelectric resonator element 30 is fixed are provided. According to the embodiment with reference to FIG. 1, the mount electrode 42 is disposed at a position where the piezoelectric resonator element 30 does not completely hide the top surface of the IC chip 12 even when both the piezoelectric resonator element 30 and the IC chip 12 are provided in the package base 34, and where the piezoelectric resonator element 30 does not overlap with the relocation pad 24 when viewed in plan. The pad electrode 40 is provided in the plural number. Some of the pad electrodes 40 are conductively coupled to the mount electrodes 42 and others are conductively coupled to external terminals 44 that are disposed on the outer face of the package base 34.

The IC chip 12 is fixed at the bottom face of the concave portion 36 such that the relocation pad 24 faces upward. One end of the wire 28 is coupled to the relocation pad 24 on the IC chip 12, and the other end of wire 28 is coupled to the pad electrode 40. The piezoelectric resonator element 30 is bonded onto the mount electrode 42 by using a conductive adhesive 46. In addition, the above-described mount electrode of the piezoelectric resonator element 30 is connected with the conductive adhesive 46. In this way, the piezoelectric resonator element 30 is conductively coupled to the external terminal 44 through the IC chip 12 and the like.

Referring to FIG. 1, the piezoelectric resonator element 30 does not overlap with the wire 28 because the arrangement of the mount electrode 42 is adequately selected as described above and the position of the inner pad 16 is practically changed through the relocation pad 24 on the IC chip 12. Meanwhile, the lid 48 is placed and fixed on the upper face of the package base 34 so that the concave portion 36 is air-tightly sealed.

IC chip 12 in the above-described piezoelectric device 10 has the relocation wire 18 and the relocation pad 24 and the like thereby it is possible to change the position of the inner pad 16 freely. In addition, the position of the mount electrode 42 can also be freely changed according to the plan shape of the piezoelectric resonator element 30 and the position of the relocation pad 24. In this way, the wire 28 is disposed adjacent to the piezoelectric resonator element 30 but not disposed between the piezoelectric resonator element 30 and the IC chip 12 so that it is possible to shorten the gap between the piezoelectric resonator element 30 and the IC chip 12 at least by the size of the loop of the wire 28.

In recent years, the size of the IC chip 12 has been dramatically reduced and the planar size of the IC chip 12 becomes smaller than the planar size of the piezoelectric resonator element 30. Even though the planar size of the IC chip 12 is reduced, the same number of the pads are required if the IC chip has the functions that are same as a commonly-used large-sized IC chip. In case of the commonly-used large-sized IC chip, pads are arranged along the two shorter sides of the IC chip. If the pads are arranged this way for the smaller-sized IC chip, the piezoelectric resonator element is placed over at least the pads which are arranged along one shorter side of the IC chip so that it is required to secure height in the IC device in order to prevent the wires from contacting with the piezoelectric resonator element. In this respect, the piezoelectric device 10 according to the embodiment can change the position of the inner pad 16 by providing the relocation wire 18 and the like on the IC chip 12 therefore it is possible to reduce the height of the device.

The position of the inner pad 16 can be freely changed because the relocation wire 18 and the like are provided in the IC chip 12. Even when the inner pads 16 can only be arranged along one edge of the active face 14a of the semiconductor element 14, it is possible to secure the area where the piezoelectric resonator element 30 overlaps with the IC chip 12 and to prevent the piezoelectric resonator element 30 from covering the wire 28 at the same time by arranging the relocation pads 24 in L-shape or the like. Consequently, it is possible to reduce the planar size of the piezoelectric device 10.

Moreover, there is no particular limitation for the shape of the IC chip 12 and for the position of the inner pad 16 which is provided on the active face 14a of the semiconductor element 14. Therefore only one type of the semiconductor element 14 having certain functions is enough to accommodate various arrangements of the IC chip 12 and the piezoelectric resonator element 30 because the inner pads 16 can be located anywhere through the relocation wires 18 and the like. In this way, it is possible to increase the versatility of the semiconductor element 14 (the IC chip 12) and to reduce the production cost of the piezoelectric device 10.

When the semiconductor element 14 is an oscillation circuit, the piezoelectric device 10 serves as a piezoelectric oscillator. The piezoelectric device 10, which is the piezoelectric oscillator, can output a signal having a predetermined frequency. The semiconductor element 14 can further include a voltage control circuit, a temperature compensation circuit and the like in addition to the oscillation circuit. The voltage control circuit makes it possible to change or modulate the frequency of the signal outputted from the oscillation circuit through a control voltage which is inputted from outside. The piezoelectric device 10 that is equipped with such voltage control circuit becomes a voltage controlled piezoelectric oscillator. The temperature compensation circuit reduces the frequency change in the signal outputted from the oscillation circuit even when an ambient temperature around the piezoelectric resonator element 30 changes. The piezoelectric device 10 that is equipped with such temperature compensation circuit becomes a temperature compensated piezoelectric oscillator.

Figure 5:
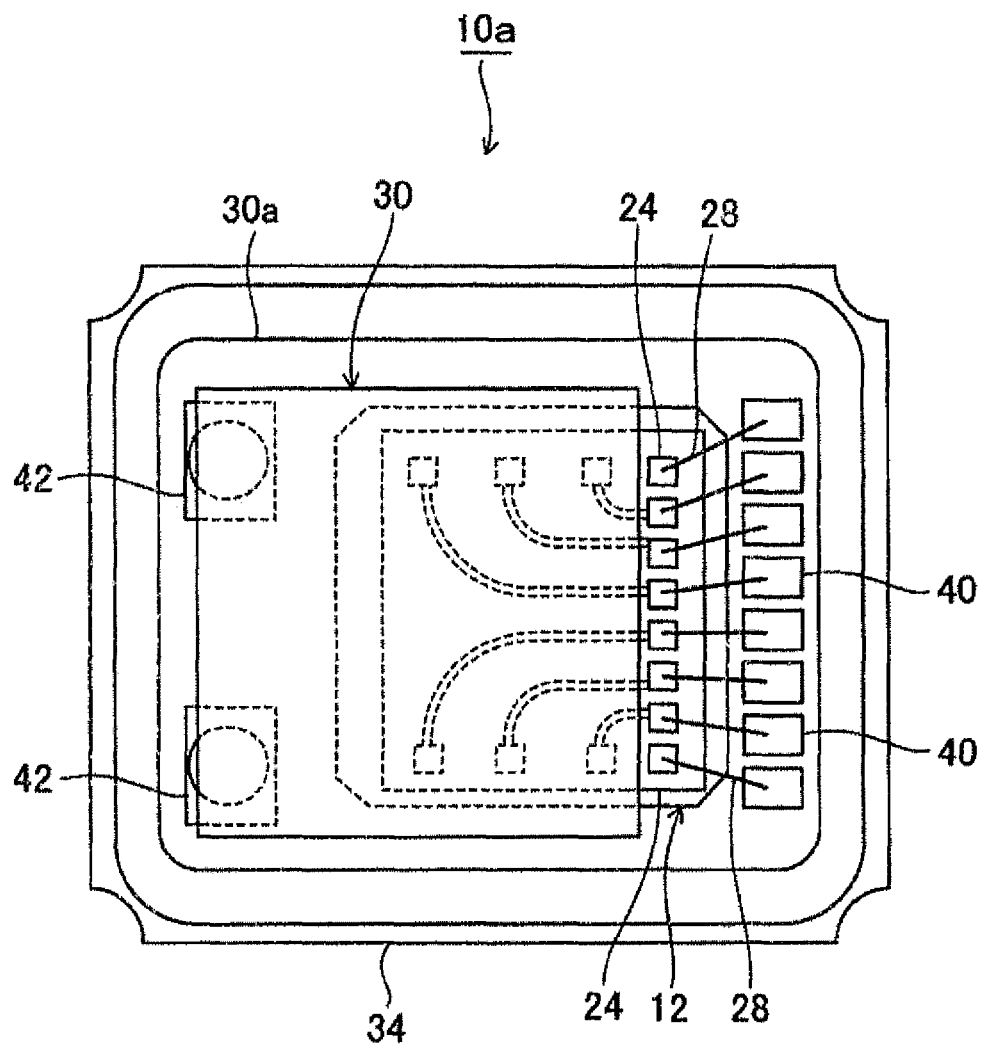
FIG. 5 is an explanatory drawing of an embodiment of the piezoelectric device.

Though the IC chip 12 according to the embodiment described above has the relocation pads 24 that are arranged in the L-shape, the embodiment is not limited to such IC chip 12. FIG. 5 illustrates another embodiment of the IC chip 12 in which the relocation pads 24 are arranged along any one edge of the upper face, in other words, arranged in the peripheral part of the IC chip 12. In this case shown in FIG. 5, the relocation pads 24 are disposed in the position where they are most distant from the mount electrode 42 while the IC chip 12 is disposed in the package base 34. The pad electrode 40 is disposed so as to oppose the relocation pad 24. In this way, the piezoelectric resonator element 30 does not overlap with the wire 28 thereby it is possible to lower the height of a piezoelectric device 10a.

In addition, the wire 28 is not provided besides the piezoelectric resonator element 30 along the longer side of the element therefore it is possible to adopt a wide piezoelectric plate 30a for the piezoelectric resonator element 30. When the wide piezoelectric plate 30a is adopted, the area of the above-mentioned excitation electrode becomes large, which means it is possible to obtain a high Q factor. In this way, characteristics of the piezoelectric device 10a can be stabilized.

Figure 6:
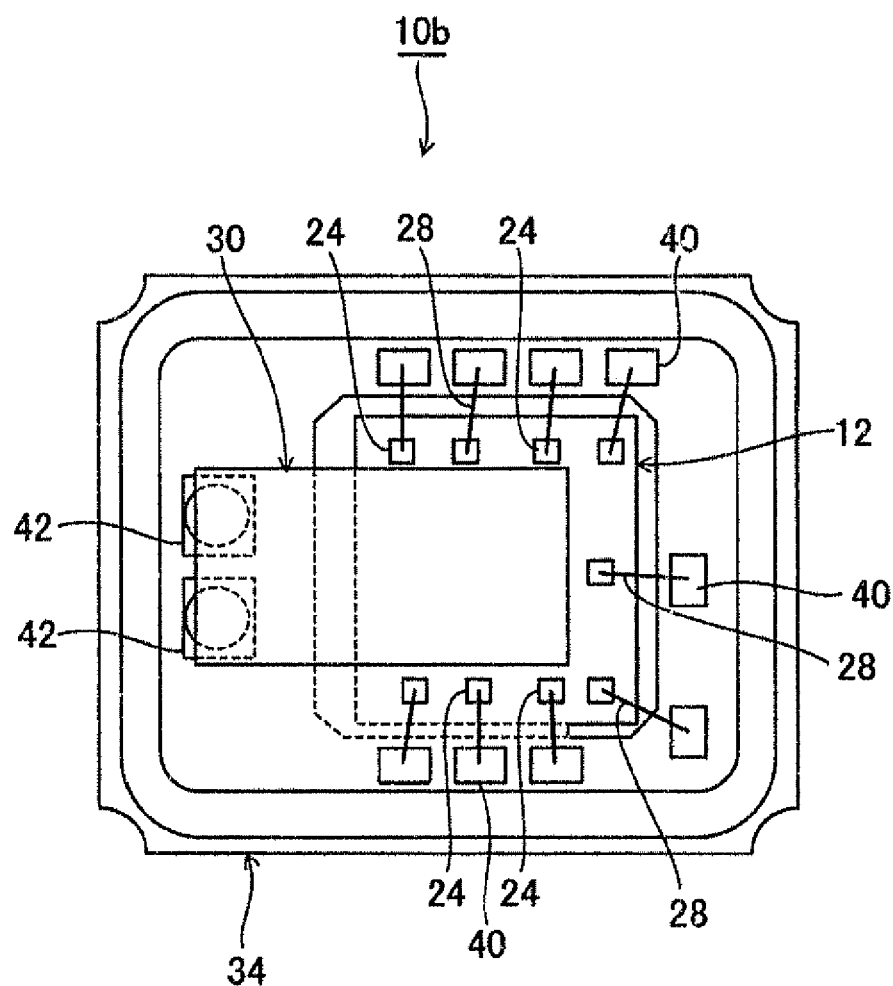
FIG. 6 is an explanatory drawing of another embodiment of the piezoelectric device.

FIG. 6 illustrates another embodiment. Referring to FIG. 6, the relocation pads 24 are disposed in the peripheral area of the upper face along three sides of the IC chip. According to the example shown in FIG. 6, the relocation pads 24 are arranged not to oppose with the mount electrode 42 but at other positions when the IC chip 12 is placed in the package base 34. The pad electrode 40 is disposed so as to oppose the relocation pad 24. In a case where the piezoelectric resonator element 30 is provided above the mount electrode 42, the piezoelectric resonator element 30 is disposed inside the relocation pads 24 which are arranged in a reversed C-shape when viewed in plan. In this way, the piezoelectric resonator element 30 does not overlap the wire 28 when viewed in plan therefore it is possible to lower the height of a piezoelectric device 10b.

Figure 7A:
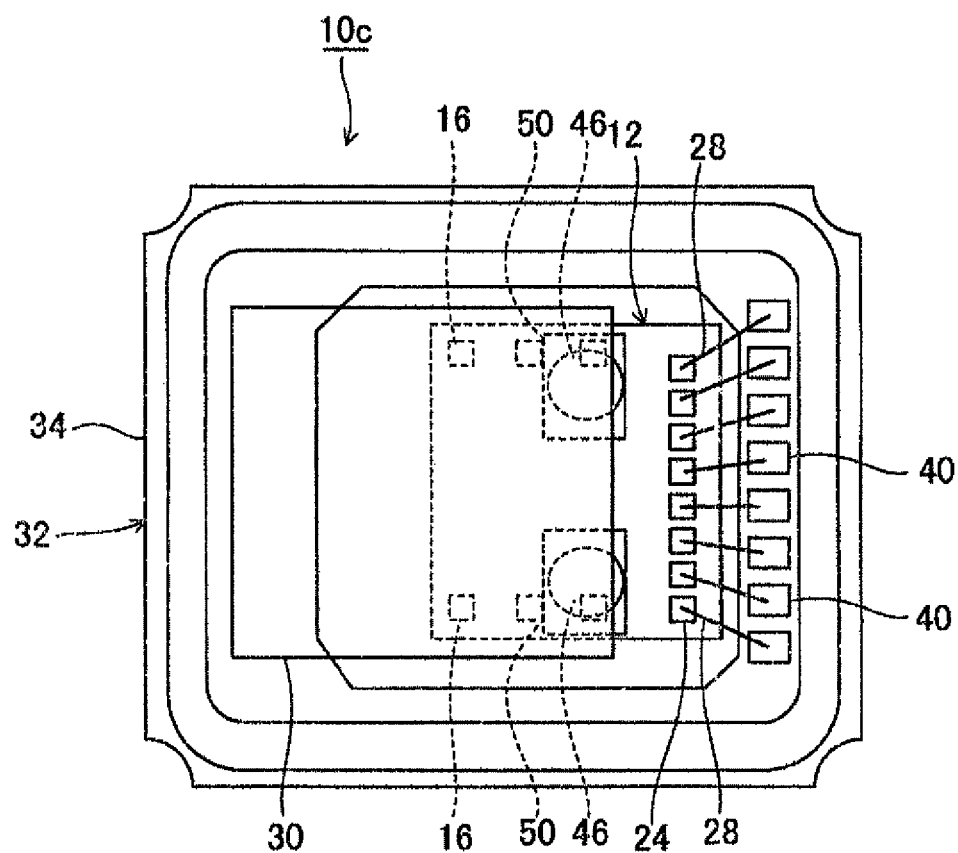
FIGS. 7A and 7B are explanatory drawings of another embodiment of the piezoelectric device.
Figure 7B:
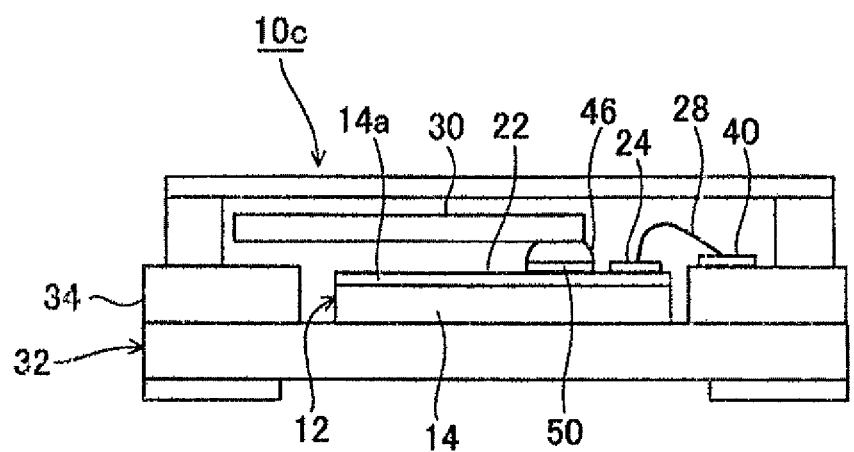

FIG. 7 shows another embodiment of the piezoelectric device. FIG. 7A is a schematic plan view and FIG. 7B is a schematic sectional view of a piezoelectric device. In addition to the relocation pads 24, a mount electrode (a relocation mount electrode 50) to which a piezoelectric resonator element 30 is coupled can be provided on the upper face of the IC chip 12. The relocation mount electrode 50 is conductively coupled with the inner pad 16 which is disposed on the active face 14a through the connector 20 that penetrates the insulating layer 22. In this embodiment, the pad electrode 40, the wire 28 and the like are not interposed between the piezoelectric resonator element 30 and the inner pad 16, which is different from the above-described embodiment. In this way, the length of the conductive path becomes shorter and it is possible to prevent floating capacitance and the like.

The IC chip 12 has the relocation pads 24 which are arranged in the periphery area and along one side of the upper face of the IC chip. The IC chip 12 is mounted in the package 32 such that the relocation pads 24 are disposed along the shorter side of the package base 34. The pad electrode 40 is disposed so as to oppose the relocation pad 24, and the wire 28 conductively couples them. The piezoelectric resonator element 30 is fixed through the conductive adhesive 46 which is applied onto the relocation mount electrode 50. The fore-end of the piezoelectric resonator element is directed to the opposite direction to the wire 28 when it is fixed by using the adhesive. In this way, the piezoelectric resonator element 30 does not overlap with the wire 28 when they are viewed in plan and thereby it is possible to reduce the height of a piezoelectric device 10c.

Figure 8A:
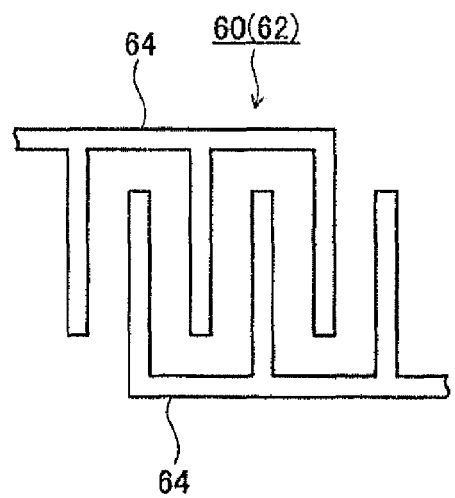
FIGS. 8A, 8B and 8C are explanatory drawings of a frequency adjustor element.

Moreover, an element for adjusting an oscillation frequency (a frequency adjustor element) can be provided in the IC chip 12. FIG. 8 is an explanatory drawing of the frequency adjustor element. FIG. 8A is an explanatory drawing of a capacitor which is the frequency adjustor element, FIG. 8B is an explanatory drawing of which can also be the frequency adjustor element, and FIG. 8C shows an embodiment in which a frequency adjustor element is coupled to the relocation wire.

Referring to FIG. 8A, a frequency adjustor element 60 is a capacitor 62 having two comb-tooth-shaped electrodes 64 oppose and interdigitate each other. In this way, it is possible to form the capacitor 62 on the active face 14a.

Figure 8B:
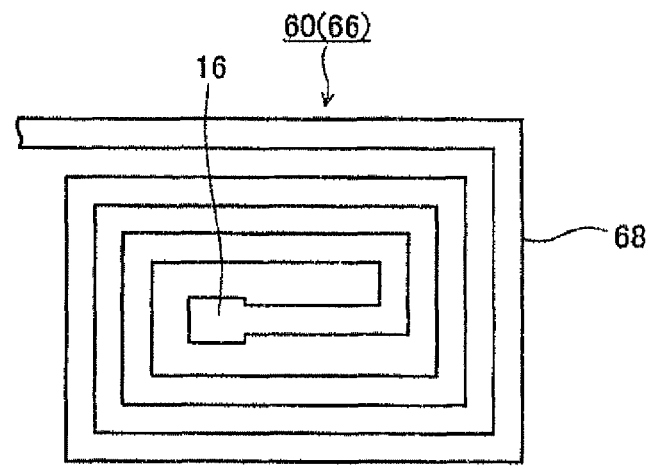

Referring to FIG. 8B, this is another example of the frequency adjustor element 60, which is a coil 66 formed from a volute-shaped electrode 68. One end of the coil 66 is conductively coupled to the inner pad 16 through the relocation wire 18. The other end of the electrode 68 is conductively coupled to the above-described connector 20 through other inner pad 16. In this way, it is possible to form the coil 66 on the active face 14a.

Figure 8C:
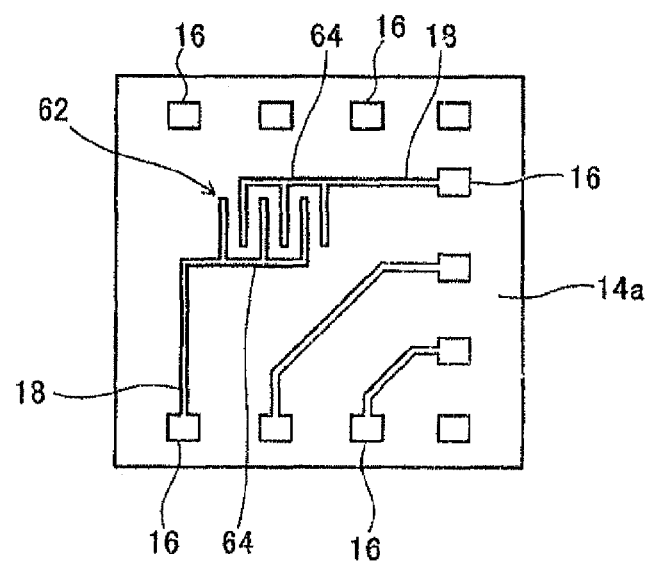

FIG. 8C shows an example in which the capacitor 62 described above with reference to FIG. 8A is provided on the active face 14a and is conductively coupled to the inner pad 16. One end of the electrode 64 which is a part of the capacitor 62 is conductively coupled to the inner pad 16 through the relocation wire 18. The other end of the electrode 64 is conductively coupled to the above-described connector 20 through the relocation wire 18 and other inner pad 16.

Other than the above-described electrodes provided on the active face 14a, the capacitor that serves as the frequency adjustor element 60 can be formed from electrodes that oppose each other in the layered direction depending on features. Such capacitor is formed from two insulating layers 22 which forms a multilayered structure. One electrode of the capacitor is interposed between the two insulating layers. The other electrode is disposed on the active face 14a and the two electrodes are disposed so as to oppose each other. The electrode disposed between the two insulating layers 22 is coupled to the inner pad 16 and the relocation pad 24 through the connector 20. The electrode provided on the active face 14a is coupled to the relocation pad 24 through the connector 20 that penetrates the insulating layers 22.

The above-described piezoelectric device 10 according to the embodiments is particularly suited for electronic apparatuses whose size in thickness is requested to be reduced. For example, the piezoelectric device 10 can be used for electronic apparatuses that need a control signal for control. Such electric apparatuses include mobile phones, personal computers and handy information terminals. When the piezoelectric device 10 is equipped in a digital mobile phone handset, the piezoelectric device 10 will have the above-described piezoelectric resonator and will be coupled to a central processing unit (CPU) that for example controls a transmitting part and a receiving part of a signal. The signal outputted from the piezoelectric device 10 is changed into an appropriate clock signal depending on how to control by using a frequency dividing circuit or the like provided in the CPU. When the piezoelectric device 10 has the above-described temperature compensation circuit and is used as a temperature compensated piezoelectric oscillator, the temperature compensated piezoelectric oscillator is coupled to the output of the above-mentioned CPU, the transmitting part and the receiving part. Even when a basic clock signal from the CPU fluctuates with change in ambient temperature, the temperature compensated piezoelectric oscillator can correct the signal and the appropriate signal can be supplied to the transmitting part and the receiving part.

The entire disclosure of Japanese Patent Application No. 2008-067193 filed Mar. 17, 2008 is expressly incorporated by reference.

What is claimed is:

1. A piezoelectric device comprising:
   an integrated circuit chip; and
   a piezoelectric resonator element, a first part of the piezoelectric resonator element being disposed so as to overlap with a part of the integrated circuit chip in plan view, and a second part of the piezoelectric resonator element being disposed so as to not overlap with the part of the integrated circuit chip in the plan view, the integrated circuit chip including:
   a part of an inner pad disposed on an active face and in an area overlapped with the piezoelectric resonator in the plan view;
   an insulating layer formed on the active face;
   a relocation pad disposed on the insulating layer so that the relocation pad is not overlapped with the piezoelectric resonator element in the plan view, the relocation pad being coupled to an end part of a first wire; and
   a second wire electrically coupling the inner pad and the relocation pad, the second wire having a relocation wire and a connector, the connector penetrates the insulating layer, the relocation wire being disposed between the insulating layer and the active face, and a lower surface of the piezoelectric element being disposed to be lower than a top of the first wire.

2. The piezoelectric device according to claim 1, the relocation pad being disposed adjacent to at least one side of a peripheral part of the integrated circuit chip.

3. The piezoelectric device according to claim 1, further comprising a frequency adjustor element adjusting oscillation frequency and being coupled to the relocation wire.

4. An electronic apparatus comprising:
   a piezoelectric device comprising:
   an integrated circuit chip; and
   a piezoelectric resonator element, a first part of the piezoelectric resonator element being disposed so as to overlap with a part of the integrated circuit chip in plan view, and a second part of the piezoelectric resonator element being disposed so as to not overlap with the part of the integrated circuit chip in the plan view, the integrated circuit chip including:
   a part of an inner pad disposed on an active face and in an area overlapped with the piezoelectric resonator in the plan view;
   an insulating layer formed on the active face; a relocation pad disposed on the insulating layer so that the relocation pad is not overlapped with the piezoelectric resonator element in the plan view, the relocation pad being coupled to an end part of a first wire; and
   a second wire electrically coupling the inner pad and the relocation pad, the second wire having a relocation wire and a connector, the connector penetrates the insulating layer, the relocation wire being disposed between the insulating layer and the active face, and a lower surface of the piezoelectric element being disposed to be lower than a top of the first wire.

5. The piezoelectric device according to claim 1, an entire length of the relocation wire being disposed between the insulating layer and the active face.

* * * * *